(12) United States Patent
Mo et al.

(10) Patent No.: US 7,687,810 B2
(45) Date of Patent: Mar. 30, 2010

(54) ROBUST LED STRUCTURE FOR SUBSTRATE LIFT-OFF

(75) Inventors: Qingwei Mo, Sunnyvale, CA (US); Arnold Daguio, Gilroy, CA (US)

(73) Assignees: Philips Lumileds Lighting Company, LLC, San Jose, CA (US); Koninklijke Philip Electronics N.V., Eindhoven (NL)

( * ) Notice: Subject to any disclaimer, the term of this patent is extended or adjusted under 35 U.S.C. 154(b) by 125 days.

(21) Appl. No.: 11/876,404

(22) Filed: Oct. 22, 2007

(65) Prior Publication Data

US 2009/0101929 A1 Apr. 23, 2009

(51) Int. Cl.
*H01L 27/15* (2006.01)
*H01L 29/40* (2006.01)
*H01L 23/29* (2006.01)

(52) U.S. Cl. .................. 257/79; 257/84; 257/737; 257/777; 257/778; 257/782; 257/788

(58) Field of Classification Search .................. 257/79, 257/84, 737, 777, 778, 782, 788; 438/22
See application file for complete search history.

(56) References Cited

U.S. PATENT DOCUMENTS

| 7,351,599 B2 * | 4/2008 | Shen et al. ............... 438/26 |
|---|---|---|
| 2002/0025099 A1 * | 2/2002 | Williams et al. .............. 385/14 |
| 2006/0091411 A1 * | 5/2006 | Ouderkirk et al. ............. 257/98 |
| 2006/0118775 A1 * | 6/2006 | Nagai et al. .................... 257/13 |
| 2006/0167174 A1 * | 7/2006 | Lamola et al. ............... 524/571 |
| 2007/0114446 A1 * | 5/2007 | Shoji et al. ............... 250/483.1 |
| 2007/0173036 A1 * | 7/2007 | Kusunoki .................... 438/465 |
| 2007/0202623 A1 * | 8/2007 | Gao et al. ...................... 438/29 |
| 2008/0061312 A1 * | 3/2008 | Gao et al. ...................... 257/99 |
| 2008/0116467 A1 * | 5/2008 | Mueller et al. ................. 257/89 |
| 2009/0034057 A1 * | 2/2009 | LeCain et al. ............... 359/296 |

* cited by examiner

*Primary Examiner*—Sue Purvis
*Assistant Examiner*—Teresa M Arroyo

(57) ABSTRACT

An etching step is performed on an LED/substrate wafer to etch through the LED epitaxial layers entirely around each LED on the substrate wafer to form a gap between each LED on the wafer. The substrate is not etched. When the LEDs/substrates are singulated, edges of each substrate extend beyond edges of the LED die. The LEDs are flip-chips and are mounted on a submount with the LED die between the submount and the substrate. An insulating underfill material is injected under the LED die and also covers the sides of the LED die and "enlarged" substrate. The substrate is then removed by laser lift-off. The raised walls of the underfill that were along the edges of the enlarged substrate are laterally spaced from the edges of the LED die so that a phosphor plate can be easily positioned on top to the LED die with a relaxed positioning tolerance.

18 Claims, 4 Drawing Sheets

ROBUST LED STRUCTURE FOR SUBSTRATE LIFT-OFF

FIELD OF THE INVENTION

This invention relates to flip-chip light emitting diodes (LEDs) and, in particular, to a process for preparing the LED for removal of the growth substrate and adding an optical element in its place.

BACKGROUND

Philips Lumileds Lighting Company, LLC has developed a technique for forming high efficiency LEDs, where the LEDs are formed as flip-chips and the growth substrate is removed after the flip-chip is mounted on a submount. In a flip-chip, both the n and p contacts are formed on the same side of the LED die opposite to the growth substrate side.

Prior art FIGS. 1-3 illustrate the general substrate lift-off process and the problems associated with adding an optical element in place of the removed substrate. Further details can be found in the assignee's U.S. patent Publications US 2006/0281203 A1 and 2005/0269582 A1, both incorporated herein by reference.

In FIG. 1, LED semiconductor epitaxial layers 10, including an n-layer, an active layer, and a p-layer, are grown on a growth substrate 12, such as a sapphire substrate. In the example, the layers 10 are GaN based, and the active layer emits blue light.

Metal electrodes 14 are formed that electrically contact the p-layer, and metal electrodes 16 are formed that electrically contact the n-layer. In the example, the electrodes are gold bumps that are ultrasonically welded to anode and cathode metal pads 18 and 20 on a ceramic submount 22. The submount 22 has conductive vias 24 leading to bottom metal pads 26 and 28 for bonding to a printed circuit board.

An underfill material 30 is then injected under and around the LED for structural support, to fill in air gaps, and to protect the chip from contaminants. The underfill 30 may be liquid silicone that is then cured to harden.

The substrate 12 is then removed using a laser lift-off process. The photon energy of the laser (e.g., an excimer laser) is selected to be above the band gap of the LED material and below the absorption edge of the sapphire substrate (e.g., between 3.44 eV and 6 eV). Pulses from the laser through the sapphire are converted to thermal energy within the first 100 nm of the LED material. The generated temperature is in excess of 1000° C. and dissociates the gallium and nitrogen. The resulting high gas pressure pushes the substrate away from the epitaxial layers to release the substrate from the layers, and the loose substrate is then simply removed from the LED structure. The underfill helps prevent the thin LED layers from breaking under the high pressure.

The growth substrate may instead be removed by etching, such as reactive ion etching (RIE). Other techniques may be used depending on the type of LED and substrate. In one example, the substrate is Si-based and an insulating material between the substrate and the LED layers is etched away by a wet etch technique to remove the substrate.

The exposed LED material may be further etched to remove damaged material and to thin the LED to enhance the light output. FIG. 2 shows the resulting structure.

Since the underfill 30 originally covered the sides of the substrate 12, the edges of the underfill remain after the substrate is removed to effectively form walls around the LED layers 10. Providing a precise amount of underfill to only fill under and around the LED layers without contacting the substrate is extremely difficult and so the structure of FIG. 2 is typical. The underfill 30 typically extends further laterally than shown in the figures in actual devices.

As shown in FIG. 3, a transparent adhesive material 32 (e.g., silicone) is deposited on the exposed LED surface layer. A preformed phosphor plate 34 is intended to be precisely positioned over the LED and glued to the top surface of the LED. Any misalignment of the plate 34 causes the plate 34 to not seat properly on the LED due to the raised underfill walls around the LED. The phosphor plate 34 may be formed of a YAG phosphor either sintered or in a transparent binder. The YAG phosphor emits yellow-green light when energized by the blue LED. The yellow-green light combined with the blue light leaking through the plate 34 produces white light. As a result of the plate 34 not seating properly, the light emission properties of the LED will not be optimal and the plate 34 may easily delaminate from the LED.

What is needed is an improved technique that avoids the above-mentioned alignment problems when affixing a phosphor plate or any other optical element to the surface of the LED in place of the removed substrate.

SUMMARY

An LED structure is disclosed that offers a greater tolerance for affixing a phosphor plate or other optical element to the top surface of an LED chip after the substrate is removed.

An extra etching step is performed on the LED/substrate wafer prior to the LEDs/substrates being singulated and mounted onto a submount. The etching step etches through the LED epitaxial layers entirely around each LED on the substrate wafer to form a gap between each LED on the wafer. The substrate is not etched. The LEDs are then singulated by cutting (or breaking) the substrate wafer approximately halfway between the etched gaps between the LEDs so that each LED will have edges of the substrate extending out beyond edges of the LED by a small amount (e.g., 0.1-0.25 mm). The substrate for each LED appears as an enlarged substrate compared to the prior art. Since the LED already undergoes etching to expose the n-layer to form the flip-chip n-electrode, the extra etching step does not require extra handling of the LED, just an extra masking and etching step.

Each singulated LED/substrate is then mounted on a submount. After an underfill is deposited and cured, the underfill fills in under the LED and covers at least a portion of the sides of the "enlarged" substrate. When the substrate is removed, there is then a gap between the walls of the underfill surrounding the LED and the LED itself. This gap relaxes the tolerance when placing the phosphor plate over the top of the LED so that the plate is affixed flush onto the surface of the LED. Additionally, the phosphor plate may be formed larger than the LED surface to prevent the blue side-emission from the LED passing around the edges of the plate. Hence, the resulting light color will be more uniform.

Variations of this technique are also described, such as the singulation step occurring after the LEDs are mounted on a submount wafer.

Instead of a phosphor plate, a lens, a reflector, or other optical element may benefit from the increased tolerance provided by the invention.

BRIEF DESCRIPTION OF THE DRAWINGS

Elements that are the same or equivalent are labeled with the same numeral.

DETAILED DESCRIPTION

As a preliminary matter, a conventional LED is formed on a growth substrate. In the example used, the LED is a GaN-based LED, such as an AlInGaN or InGaN LED, for producing blue light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

For a flip-chip, portions of the p-layers and active layer are etched away to expose an n-layer for metallization. In this way, the p contact and n contact are on the same side of the chip and can be directly electrically attached to the submount contact pads. Current from the n-metal contact initially flows laterally through the n-layer.

Other types of LEDs that can be used in the present invention include AlInGaP LED, which can produce light in the red to yellow range.

Examples of forming LEDs are described in U.S. Pat. Nos. 6,649,440 and 6,274,399, and U.S. patent Publications US 2006/0281203 A1 and 2005/0269582 A1, all assigned to Philips Lumileds and incorporated by reference.

Figure 4:
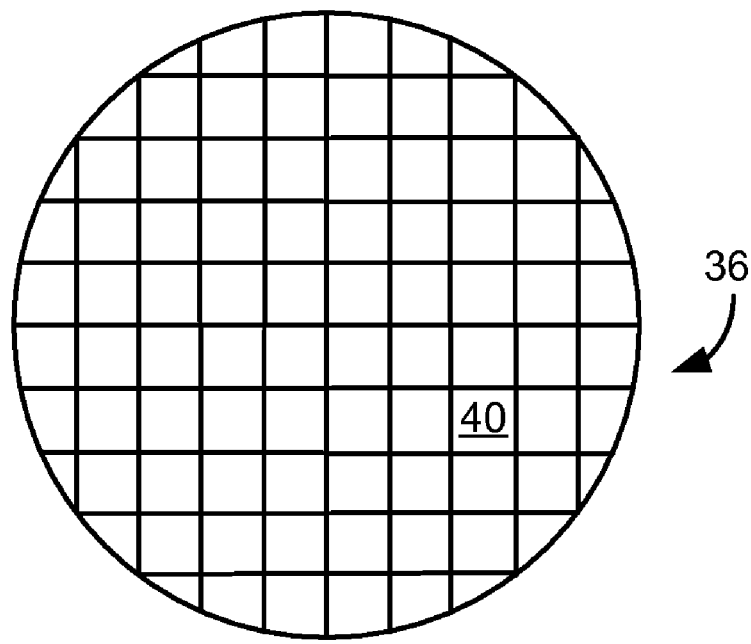
FIG. 4 is a top down view of a wafer containing many LEDs formed on a single substrate.

FIG. 4 is a top down view of a wafer 36 comprising a substrate, such as a sapphire growth substrate, with epitaxial LED layers formed thereon. The LED layers include n-layers, an active layer, and p-layers. Light is generated in the active layer. The wafer 36 is cross-hatched to show the boundaries of individual LEDs 40. In an actual example, there may be hundreds or thousands of LEDs formed on a single wafer.

Figure 5:
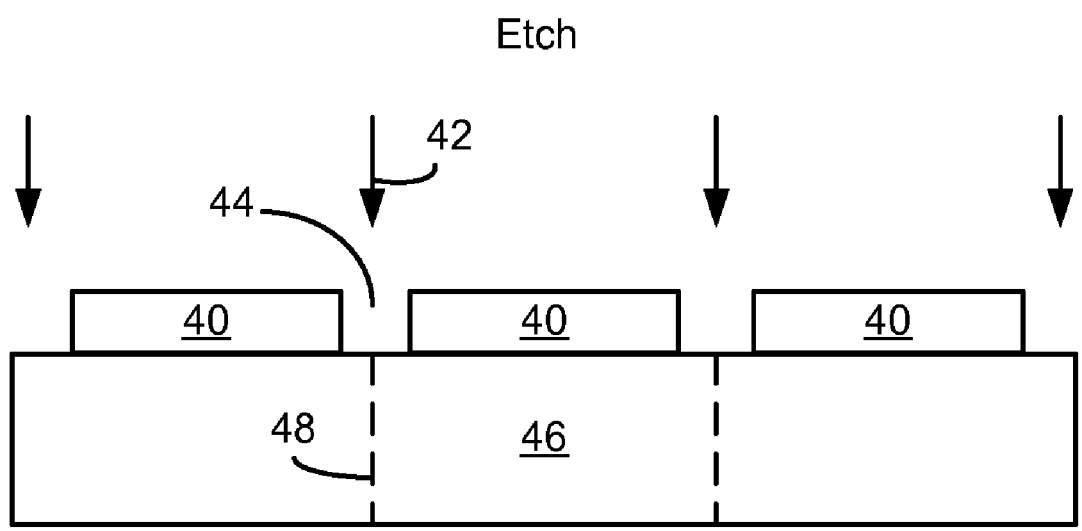
FIG. 5 is a cross-sectional view of a small portion of the wafer of FIG. 4 illustrating the extra etching step used in accordance with one embodiment of the invention.

FIG. 5 is a cross-sectional view of a small portion of the wafer 36. The LED layers are masked and subjected to a dry etch 42, such as RIE, to etch through the epitaxial layers to create a narrow gap 44 completely around each LED 40. The masking and etching are performed using conventional techniques applicable to the particular LED material and substrate 46. The substrate 46 is not etched. The LEDs 40 may have a top surface area on the order of 1 mm$^2$ or less. The gap 44 may have any suitable width, such as 0.1 mm-0.5 mm. The etching step, described previously, to gain access to the n-layers for the n-electrode can be performed before, after, or as part of the etching step shown in FIG. 5.

Figure 1:
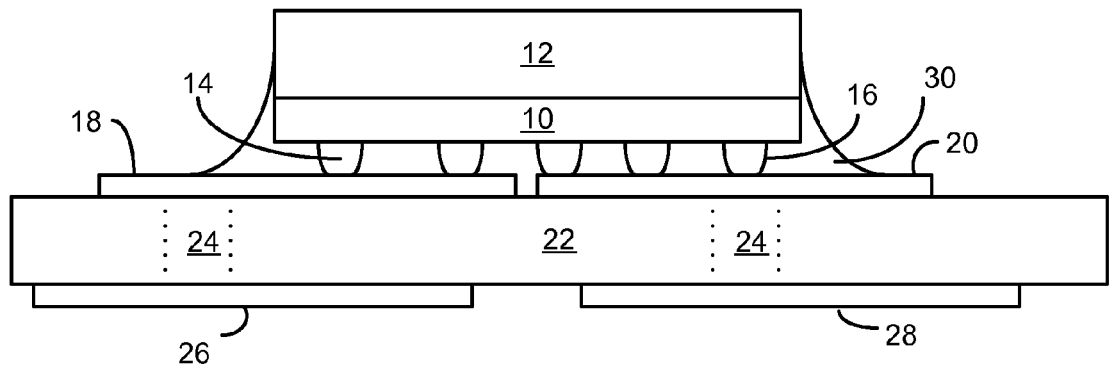
FIG. 1 is a cross-sectional view of a prior art flip-chip LED/substrate mounted on a submount with an underfill under and surrounding the LED and substrate.

The various metallization steps are then performed to create the metal connections and electrodes on the surface of the LED, described with respect to FIG. 1.

The places where the substrate 46 will ultimately be broken or cut for singulation are shown with dashed lines 48. The lines 48 are approximately through the middle of the gaps 44. Thus, the substrate 46 will extend beyond each edge of the singulated LED die by about half the gap between adjacent LEDs on the wafer (e.g., 0.05 mm-0.25 mm).

In one embodiment, the LEDs on the wafer 36 are all bonded to corresponding pads on a submount wafer at the same time before singulation. Bonding may be by ultrasonic welding, as previously described. Then, the structure is singulated by sawing or scribing/breaking to create individual LEDs mounted on submounts. Alternatively, the substrate 46 of FIG. 5 is broken along the lines 48 and the singulated LEDs/substrates are then individually mounted on respective submounts.

The LED layers will generally have a thickness between 5-20 microns, and the substrate 46 has a thickness greater than 100 microns.

Figure 6:
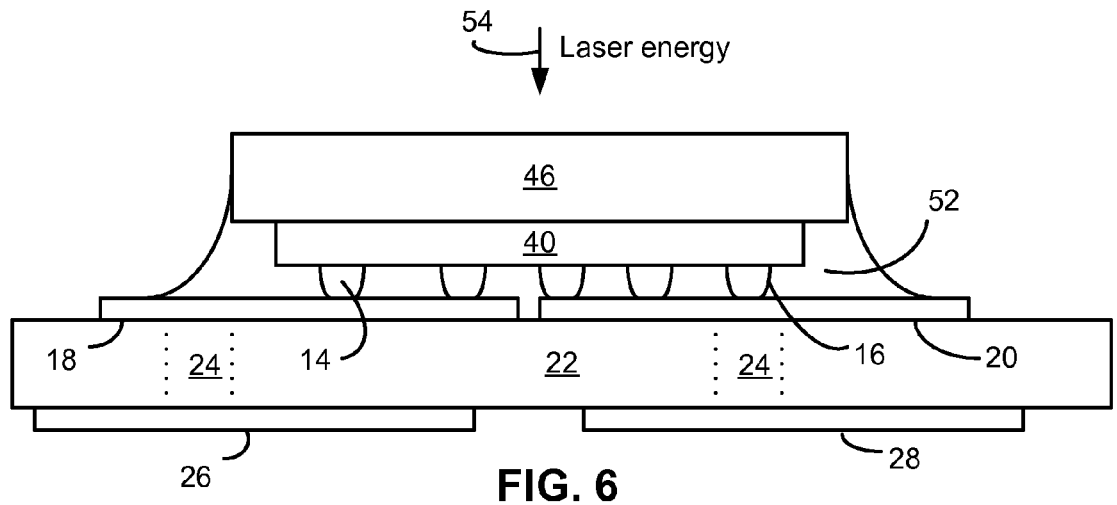
FIG. 6 is a cross-sectional view of a singulated flip-chip LED along with its "enlarged" substrate mounted on a submount with an underfill under and surrounding the LED and substrate.

FIG. 6 illustrates the resulting LED 40 and substrate 46 after being mounted on a conventional submount 22, such as that described with respect to FIG. 1. The submount is singulated to gain access to the LED 40 for the underfill process. An insulating underfill 52 is injected under and around the LED 40 for structural support, to fill in air gaps, and to protect the chip from contaminants. The underfill 52 may be liquid silicone that is then cured to harden. The underfill 52 contacts the sides of the substrate 46 to ensure adequate coverage of the underfill 52.

Figure 6A:
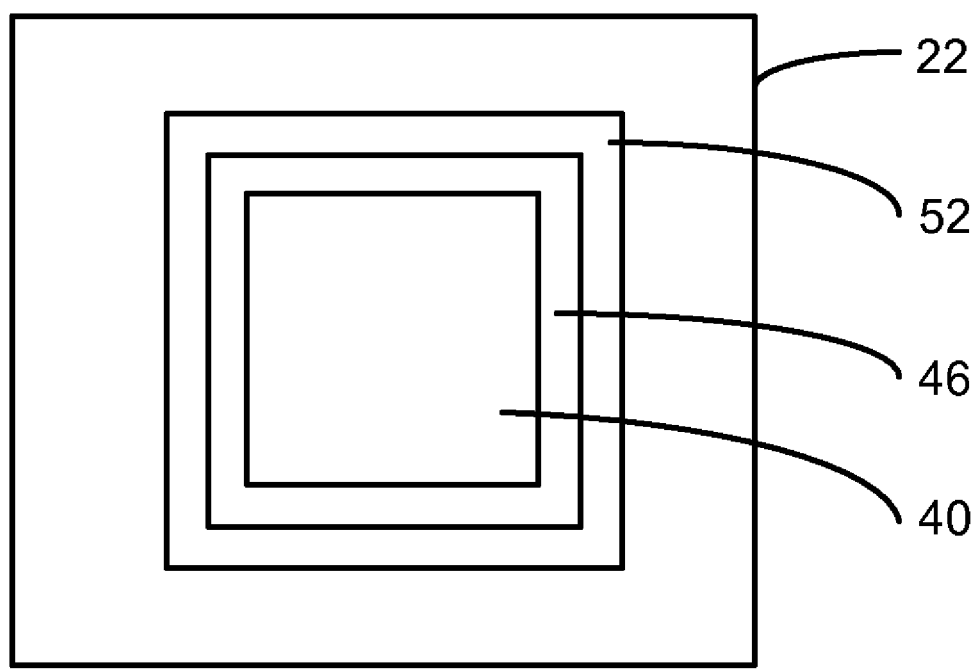
FIG. 6A is a top down view of FIG. 6.

FIG. 6A is a top down view of FIG. 6 showing how the substrate 46 is longer and wider than the LED 40 and how the underfill 52 surrounds the substrate 46.

Figure 2:
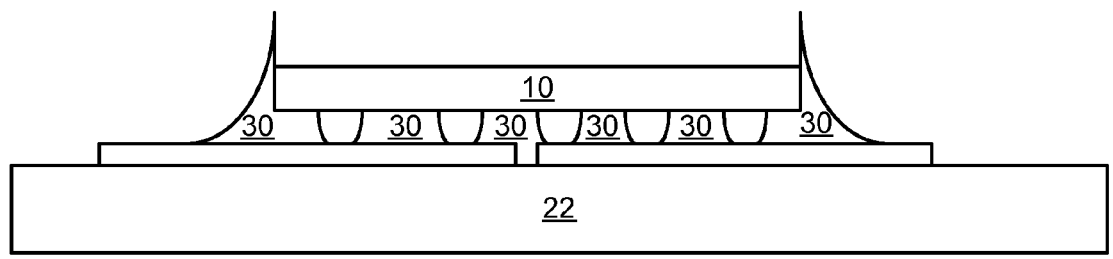
FIG. 2 illustrates the structure of FIG. 1 with the substrate removed.

An excimer laser beam 54 is applied to the surface of the sapphire substrate 46, as described with respect to FIG. 1, to remove the substrate 46. The substrate 46 may be removed by any of the aforementioned methods. After the substrate is removed, the LED epitaxial layers may be etched the remove damaged material and to thin the LED for improved light extraction. The LED 40 may be similar to the LED 10 described with respect to FIGS. 1 and 2 except for its dimensions relative to the removed substrate 46.

Figure 3:
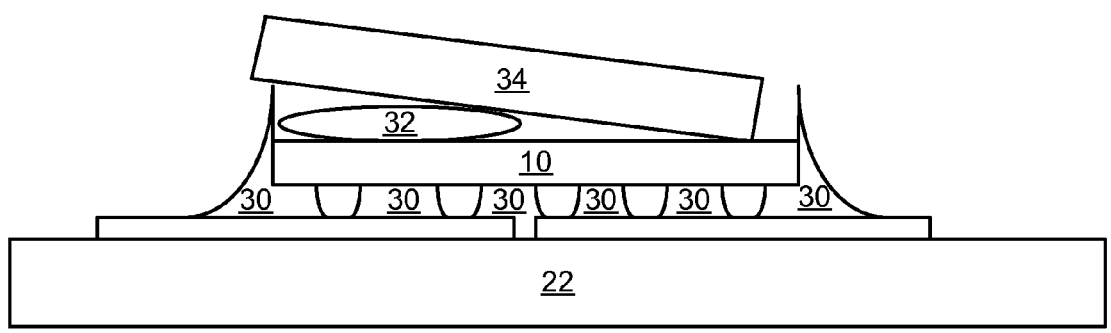
FIG. 3 illustrates a problem with the structure of FIG. 2 when an optical element is intended to be affixed directly to the top surface of the exposed LED but there is some misalignment.
Figure 7:
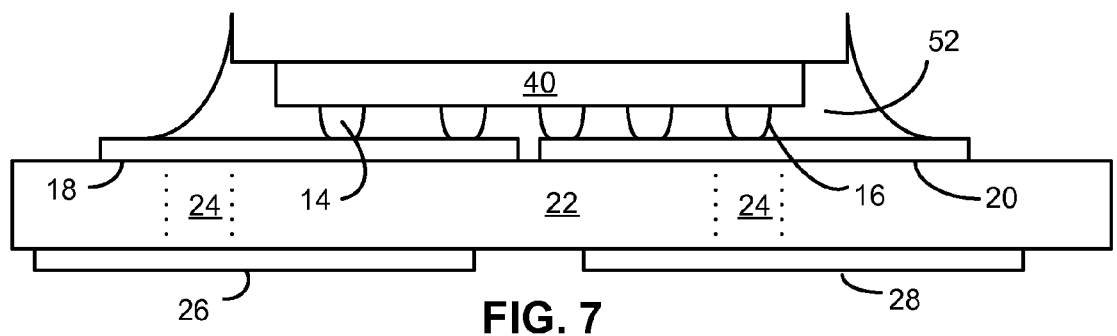
FIG. 7 illustrates the structure of FIG. 6 with the substrate removed, wherein there is a gap between the underfill walls and the exposed LED surface.

As seen in FIG. 7, the allowable area for a phosphor plate or any other optical element is wider than the area shown in FIG. 3, since the walls of the underfill 52 are separated from the edges of the LED 40. This allows the positioning of the plate or optical element to have a less stringent tolerance compared to the positioning required in FIG. 3.

Figure 8:
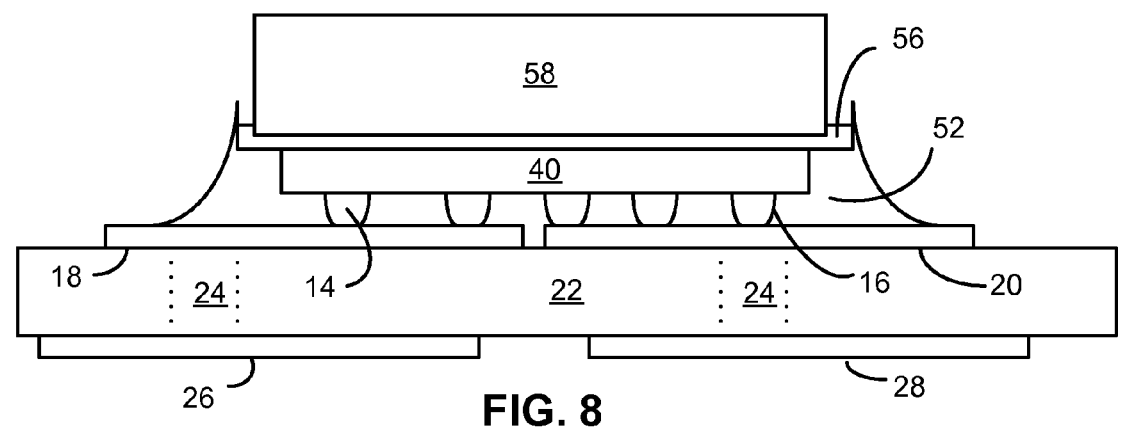
FIG. 8 illustrates the increased tolerance obtained when an optical element is placed over the LED and affixed directly to the top surface of the LED.

As shown in FIG. 8, a suitable transparent adhesive 56 is injected, sprayed, or otherwise deposited over the LED. Then, an optical element 58, such as a phosphor plate, a Fresnel lens or other type of lens, or even a reflector, is positioned over the LED 40, using conventional automated pick and place equipment. The element 58 is then supplied downward pressure, and the adhesive 56 is cured.

The larger allowable area for positioning the element 58 enables the element 58 to be wider than the LED 40 itself. Therefore, any upward light emitted from the sides of the LED is still converted by the optical element. The allowable placement area may be any suitable size to obtain the desired yield from the pick and place step. There is a tradeoff between the size of the placement area and lost LED material due to the etching.

In one embodiment, the LED 40 die emits blue light, and the phosphor emission from the phosphor plate in conjunction with the blue light results in a white light being generated. For example, the phosphor plate may contribute a yellow component or red and green components to the blue light to create white light. One such suitable phosphor is a YAG phosphor.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating a light emitting device comprising:
   providing a flip-chip light emitting diode (LED) die on a substrate, wherein the LED is mounted on a submount such that the LED die is between the submount and the substrate, the substrate being wider and longer than the LED die so that edges of the substrate extend over edges of the LED die;
   providing an insulating underfill between the LED die and the submount and around edges of the LED die and substrate;
   removing the substrate from the LED die, wherein walls are formed around the LED die by portions of the underfill that were around the edges of the substrate, inner boundaries of the walls being laterally separated from the edges of the LED die; and
   placing an optical element over an exposed surface of the LED die after the substrate has been removed, at least portions of edges of the optical element being within the walls of the underfill, the optical element having a preformed shape prior to being placed over the exposed surface of the LED die, the optical element having length and width outer dimensions,
   wherein the length dimension of the optical element is less than a length dimension of the inner boundaries of the walls, and wherein the width dimension of the optical element is less than a width dimension of the inner boundaries of the walls, so that there is a relaxed tolerance when placing the optical element flush over the exposed surface of the LED die, and wherein all edges of the preformed optical element overhang edges of the LED die.

2. The method of claim 1 wherein removing the substrate comprises removing the substrate using a laser lift-off technique.

3. The method of claim 1 wherein providing an LED die on a substrate comprises:
   providing a wafer having LED layers formed over a substrate wafer
   etching epitaxial layers of LED material around an LED area to expose portions of the substrate along side edges of the LED area; and
   separating the LED area from the wafer to form the LED die on the substrate so that the edges of the substrate extend over the edges of the LED die.

4. The method of claim 1 wherein the substrate is a growth substrate.

5. The method of claim 4 wherein the substrate is sapphire.

6. The method of claim 1 wherein providing an LED die on a substrate, wherein the LED is mounted on a submount, comprises bonding electrodes on a surface of the LED die to corresponding electrodes on a surface of the submount.

7. The method of claim 1 wherein providing an insulating underfill comprises injecting an underfill between the LED die and the submount and around edges of the LED die and substrate.

8. The method of claim 1 wherein an edge of the substrate extends over an edge of the LED die by at least 0.05 mm.

9. The method of claim 1 wherein an edge of the substrate extends over an edge of the LED die by at least 0.1 mm.

10. The method of claim 1 wherein placing an optical element over an exposed surface of the LED die comprises placing a phosphor plate over the exposed surface of the LED die.

11. The method of claim 1 wherein placing an optical element over an exposed surface of the LED die comprises adhesively securing the optical element onto the exposed surface of the LED die.

12. The method of claim 1 wherein placing an optical element over an exposed surface of the LED die comprises placing an optical element, having surface dimensions larger than surface dimensions of the LED die, over the exposed surface of the LED die such that at least one edge of the optical element extends over an edge of the LED die.

13. The method of claim 1 wherein placing an optical element over an exposed surface of the LED die comprises placing a lens over the exposed surface of the LED die.

14. A light emitting device comprising:
   a flip-chip light emitting diode (LED) die, wherein the LED die was formed on a substrate that has been removed from the LED die;
   a submount on which the LED die is mounted;
   an insulating underfill between the LED die and the submount and around edges of the LED die, wherein walls of the underfill material extend above and around an exposed surface of the LED, and wherein inner boundaries of the walls are laterally separated from edges of the LED die; and
   an optical element positioned and affixed over the exposed surface of the LED die, at least portions of edges of the optical element being within the inner boundaries of the walls of the underfill, the optical element having a preformed shape prior to being affixed over the exposed surface of the LED die, the optical element having length and width outer dimensions,
   wherein the length dimension of the optical element is less than a length dimension of the inner boundaries of the walls, and wherein the width dimension of the optical element is less than a width dimension of the inner boundaries of the walls, so that there is a relaxed tolerance when positioning the optical element flush over the exposed surface of the LED die, and wherein all edges of the preformed optical element overhang edges of the LED die.

15. The device of claim 14 wherein the optical element is a phosphor plate secured to the exposed surface of the LED die.

16. The device of claim 14 wherein the optical element is a lens secured to the exposed surface of the LED die.

17. The device of claim 14 wherein the inner boundaries of the walls are laterally separated from edges of the LED die by at least 0.05 mm.

18. A light emitting device formed using the method comprising:
   providing a flip-chip light emitting diode (LED) die on a substrate, wherein the LED is mounted on a submount such that the LED die is between the submount and the substrate, the substrate being wider and longer than the LED die so that edges of the substrate extend over edges of the LED die;

providing an insulating underfill between the LED die and the submount and around edges of the LED die and substrate;

removing the substrate from the LED die, wherein walls are formed around the LED die by portions of the underfill that were around the edges of the substrate, inner boundaries of the walls being laterally separated from the edges of the LED die; and placing an optical element over an exposed surface of the LED die after the substrate has been removed, at least portions of edges of the optical element being within the walls of the underfill, the optical element having a preformed shape prior to being placed over the exposed surface of the LED die, the optical element having length and width outer dimensions, wherein the length dimension of the optical element is less than a length dimension of the inner boundaries of the walls, and wherein the width dimension of the optical element is less than a width dimension of the inner boundaries of the walls, so that there is a relaxed tolerance when placing the optical element flush over the exposed surface of the LED die, and wherein all edges of the preformed optical element overhang edges of the LED die.

* * * * *